(12) United States Patent
Borrego Lambin Torres Amaral et al.

(10) Patent No.: US 11,574,879 B2
(45) Date of Patent: Feb. 7, 2023

(54) DEVICE PACKAGE WITH REDUCED RADIO FREQUENCY LOSSES

(71) Applicant: Infineon Technologies AG, Neubiberg (DE)

(72) Inventors: Pedro Augusto Borrego Lambin Torres Amaral, Villach (AT); Ewa Brox-Napieralska, Munich (DE); Bernd Goller, Otterfing (DE); Andreas Wiesbauer, Poertschach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 950 days.

(21) Appl. No.: 16/402,683

(22) Filed: May 3, 2019

(65) Prior Publication Data

US 2019/0259716 A1 Aug. 22, 2019

Related U.S. Application Data

(62) Division of application No. 15/628,365, filed on Jun. 20, 2017, now abandoned.

(51) Int. Cl.
*H01L 23/66* (2006.01)
*H01L 23/552* (2006.01)
(Continued)

(52) U.S. Cl.
CPC ............ *H01L 23/66* (2013.01); *B81B 7/0064* (2013.01); *H01L 21/4817* (2013.01); *H01L 23/053* (2013.01); *H01L 23/06* (2013.01); *H01L 23/20* (2013.01); *H01L 23/48* (2013.01); *H01L 23/552* (2013.01); *H01L 24/03* (2013.01); *H01Q 1/2283* (2013.01); *H01Q 1/38* (2013.01); *H01L 24/16* (2013.01); *H01L 24/27* (2013.01); *H01L 24/29* (2013.01); *H01L 24/32* (2013.01); *H01L 24/83* (2013.01); *H01L 24/92* (2013.01); *H01L 2224/16227* (2013.01);
(Continued)

(58) Field of Classification Search
CPC .... H01L 23/66; H01L 21/4817; H01L 23/552
See application file for complete search history.

(56) References Cited

U.S. PATENT DOCUMENTS 7,790,492 B1 9/2010 Baumhauer, Jr. et al.
8,126,166 B2 2/2012 Song
(Continued)

FOREIGN PATENT DOCUMENTS

| CN | 102131139 A | 7/2011 |
|---|---|---|
| DE | 102010026519 A1 | 1/2012 |
| WO | 2016104576 A1 | 6/2016 |

*Primary Examiner* — Errol V Fernandes
(74) *Attorney, Agent, or Firm* — Slater Matsil, LLP

(57) ABSTRACT

A device package includes a semiconductor device. The semiconductor device is disposed on a substrate. The device package further includes a covering. The covering is disposed on the substrate and surrounds the semiconductor device. The covering includes a void, a first layer, and a second layer. The void is between an interior surface of the covering and the semiconductor device. The first layer has a first electrical conductivity and a first thickness. The second layer is disposed under the first layer. The second layer has a second electrical conductivity and a second thickness. The first electrical conductivity is greater than the second electrical conductivity. The first thickness is less than the second thickness.

21 Claims, 8 Drawing Sheets

(51) Int. Cl.
*H01L 23/48* (2006.01)
*H01L 23/00* (2006.01)
*H01Q 1/22* (2006.01)
*H01Q 1/38* (2006.01)
*B81B 7/00* (2006.01)
*H01L 23/06* (2006.01)
*H01L 23/20* (2006.01)
*H01L 21/48* (2006.01)
*H01L 23/053* (2006.01)

(52) U.S. Cl.
CPC ............... *H01L 2224/2732* (2013.01); *H01L 2224/2919* (2013.01); *H01L 2224/32225* (2013.01); *H01L 2224/48091* (2013.01); *H01L 2224/48137* (2013.01); *H01L 2224/48227* (2013.01); *H01L 2224/73265* (2013.01); *H01L 2224/83192* (2013.01); *H01L 2224/83851* (2013.01); *H01L 2224/92247* (2013.01); *H01L 2924/1433* (2013.01); *H01L 2924/1461* (2013.01); *H01L 2924/15151* (2013.01); *H01L 2924/16152* (2013.01); *H01L 2924/16196* (2013.01); *H01L 2924/16251* (2013.01); *H01L 2924/3025* (2013.01)

(56) References Cited

U.S. PATENT DOCUMENTS

| | | |
|---|---|---|
| 2007/0071268 A1 | 3/2007 | Harney et al. |
| 2008/0083960 A1 | 4/2008 | Chen et al. |
| 2008/0247585 A1 | 10/2008 | Leidl et al. |
| 2008/0283988 A1 | 11/2008 | Huang et al. |
| 2009/0305467 A1 | 12/2009 | Goto et al. |
| 2010/0072862 A1 | 3/2010 | Berger et al. |
| 2011/0198714 A1 | 8/2011 | Yang |
| 2012/0126347 A1 | 5/2012 | Yang et al. |
| 2012/0237073 A1 | 9/2012 | Goida et al. |
| 2014/0017843 A1* | 1/2014 | Jung ............... B81C 1/00269 438/51 |
| 2014/0291783 A1 | 10/2014 | Talag et al. |
| 2014/0332947 A1* | 11/2014 | Yang ............... H01L 23/053 257/710 |
| 2015/0070236 A1 | 3/2015 | Walters et al. |
| 2017/0064458 A1* | 3/2017 | Chen ............... B81B 3/0021 |
| 2017/0148744 A1* | 5/2017 | Carson ............... H01L 21/561 |

\* cited by examiner

DEVICE PACKAGE WITH REDUCED RADIO FREQUENCY LOSSES

This application is a divisional of U.S. patent application Ser. No. 15/628,365, filed on Jun. 20, 2017, which application is hereby incorporated herein by reference.

TECHNICAL FIELD

The present invention relates generally to a device package, and, in particular embodiments, to device package structures and the methods of formation thereof.

BACKGROUND

As electronics become smaller and more portable, many different types of devices may be confined to a small volume within a case or on a substrate. Due to the high device density, closely spaced devices may adversely affect one another. Consequently, an important design consideration for device packages may be to limit unwanted effects caused by nearby devices.

As a specific example, a sensor operating in a harsh radio frequency environment may experience error in sensor readings due to radio frequency signals. Radio frequency signals that are incident on the sensor package may interfere directly with sensor readings or may induce electric currents in the sensor package that generate heat at the sensor. This heat may introduce error in sensor readings. Sensor packages that reduce or eliminate radio frequency interference and heat generation at the sensor caused by nearby radio frequency devices may be desirable.

SUMMARY

In accordance with an embodiment of the invention, a device package includes a semiconductor device. The semiconductor device is disposed on a substrate. The device package further includes a covering. The covering is disposed on the substrate and surrounds the semiconductor device. The covering includes a void, a first layer, and a second layer. The void is between an interior surface of the covering and the semiconductor device. The first layer has a first electrical conductivity and a first thickness. The second layer is disposed under the first layer. The second layer has a second electrical conductivity and a second thickness. The first electrical conductivity is greater than the second electrical conductivity. The first thickness is less than the second thickness.

In accordance with another embodiment of the invention, a method of forming a device package includes attaching a semiconductor device to a substrate, forming a covering, and attaching the covering to the substrate with the semiconductor device. Forming the covering includes forming a first layer over a second layer. A conductivity of the first layer is greater than a conductivity of the second layer. A thickness of the first layer is less than a thickness of the second layer. Forming the covering further includes mechanically shaping the covering to a cup-shaped structure comprising an opening. The semiconductor device is disposed in the opening.

In accordance with still another embodiment of the invention, a device package includes a multilayer protective covering. The multilayer protective covering includes a core layer, an electrically conductive layer, a corrosion resistant layer, and a metal layer. The core layer is for mechanically supporting the covering. The core layer has a first thickness less than 200 µm. The electrically conductive layer is disposed over a first surface of the core layer. The electrically conductive layer has a second thickness less than 20 µm. The multilayer protective covering is indented to include a recessed region. The core layer surrounds the recessed region. The corrosion resistant layer is disposed over the electrically conductive layer. The metal layer is disposed over the corrosion resistant layer.

BRIEF DESCRIPTION OF THE DRAWINGS

For a more complete understanding of the present invention, and the advantages thereof, reference is now made to the following descriptions taken in conjunction with the accompanying drawings, in which:

FIG. 3A illustrates a core layer of the multilayer protective covering, FIG. 3B illustrates the multilayer protective covering after forming an electrically conductive layer on the core layer, FIG. 3C illustrates the multilayer protective covering after forming an outer surface layer and an inner surface layer on the electrically conductive layer and the core layer respectively, and FIG. 3D illustrates the multilayer protective covering after shaping the multilayer protective covering;

FIG. 4A illustrates the device package after forming conductive pads on the substrate, FIG. 4B illustrates the device package after forming an opening in the substrate, FIG. 4C illustrates the device package after attaching a sensor and an integrated circuit chip to the conductive pads on the substrate, and FIG. 4D illustrates the device package after forming electrical connections to the sensor and the integrated circuit chip using wire bonds;

FIG. 6A illustrates an example multilayer protective covering in which a segment of the multilayer protective covering is indicated, FIG. 6B illustrates an example structure of the multilayer protective covering, FIG. 6C illustrates another example structure of the multilayer protective covering, FIG. 6D illustrates yet another example structure of the multilayer protective covering, and FIG. 6E illustrates still another example structure of the multilayer protective covering;

FIG. 8A illustrates an example structure of a multilayer protective covering including a thermally insulating layer, FIG. 8B illustrates another example structure of a multilayer protective covering including a thermally insulating layer, FIG. 8C illustrates yet another example structure of a multilayer protective covering including a thermally insulating layer, and FIG. 8D illustrates still another example structure of a multilayer protective covering including a thermally insulating layer;

Figure 1:
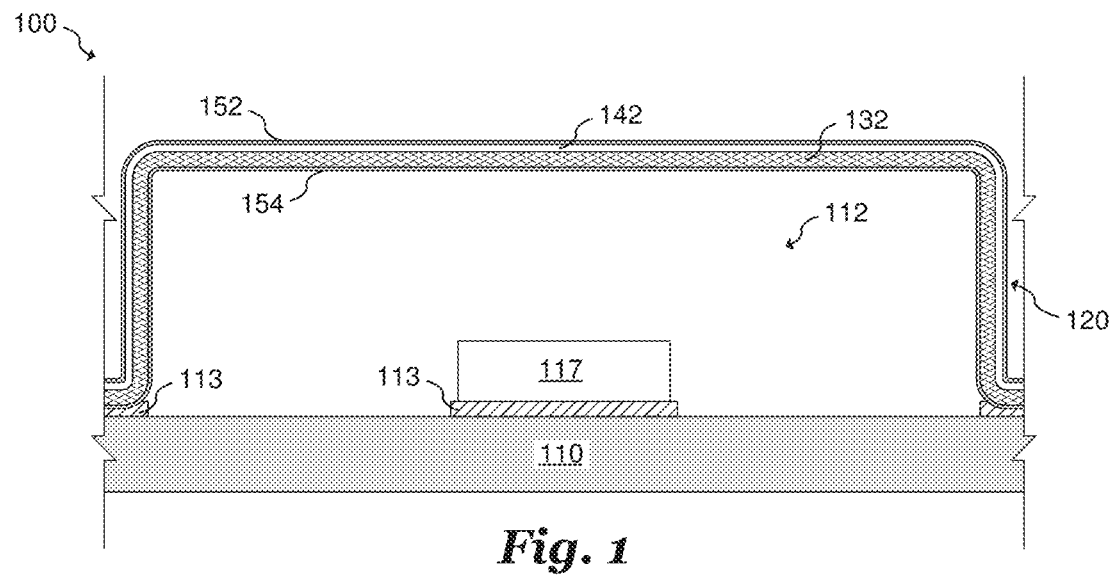
FIG. 1 illustrates an example device package in which a device is enclosed by a multilayer protective covering in accordance with an embodiment of the invention.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Device packages that limit the effects of radio frequency signals may be useful in applications that include sensitive devices that are in range of radio frequency devices, especially when the sensitive devices are negatively influenced by electromagnetic radiation and/or temperature variation. Electrically conductive protective coverings may be used to prevent radio frequency signals from reaching sensitive devices. However, even if the radio frequency signals do not pass through the protective covering, the radio frequency signals may still induce electric currents known as eddy currents in the protective covering. These eddy currents can convert the electromagnetic energy of the radio frequency signals into thermal energy due to the resistivity of the material in the protective covering. This loss of energy or power from the radio frequency signal is called radio frequency loss.

Thermal energy generated in the protective covering due to radio frequency losses may be transferred to the sensitive device through heat transfer mechanisms such as convection, diffusion, radiation, and the like. Since the quantity of thermal energy generated may be directly related to radio frequency losses, reducing radio frequency losses in the protective covering may reduce or eliminate heat transfer to devices enclosed by the protective covering.

In various embodiments, a semiconductor device package with reduced radio frequency losses is implemented using a multilayer protective covering, which may be attached to a carrier or substrate. The carrier includes one or more devices attached to the carrier and enclosed by the multilayer protective covering. The multilayer protective covering includes a core layer and an electrically conductive layer. The core layer is thicker than the electrically conductive layer. An empty space or void is formed by the multilayer protective covering such that the multilayer protective covering does not directly contact the devices enclosed within.

The multilayer protective covering may have the benefit of reducing thermal crosstalk between devices. The combination of the core layer and the electrically conductive layer may advantageously and simultaneously provide mechanical stability and high electrical conductivity. The multilayer protective covering may be a low-cost solution compared to conventional protective coverings with similar properties. Additionally, the multilayer protective covering may be formed such that it is also resistant to corrosion and chemical stress. The multilayer protective covering may also have the benefit of having solderable outer surfaces so that it can be electrically coupled to a ground potential, for example.

In some cases, most or all of the induced electric current may advantageously flow in the electrically conductive layer of the multilayer protective covering. This may have the additional benefit of enabling a larger variety of materials as viable options for the core layer. The electrical conductivity of the electrically conductive layer may advantageously allow the multilayer protective covering to be thinner than conventional protective coverings with similar properties. This may also reduce the weight, cost, and footprint of the device package.

Embodiments provided below describe various structures of device packages and various methods of forming device packages, in particular, device packages that have reduced radio frequency losses. The device packages as described herein may have various advantages over conventional device packages. The following description describes the embodiments. Two embodiment device packages that have a multilayer protective covering will be described using FIGS. 1 and 2. An embodiment process flow for forming a multilayer protective covering will be described using FIGS. 3A-3D. An embodiment process flow for forming a device package will be described using FIGS. 4A-4D. An enlarged view of an embodiment device package that may result as a product of the process flows of FIGS. 3A-3D and 4A-4D will be described using FIG. 5. Several embodiment multilayer protective coverings will be described using FIGS. 6A-6E. Several representative dimensions of an embodiment multilayer protective covering will be described using FIG. 7. Various embodiment multilayer protective coverings that have a thermally insulating layer will be described using FIGS. 8A-8D. FIG. 9 and to will be used to describe the relationship between radio frequency loss and the thickness of the conductive layer.

FIG. 1 illustrates an example device package in which a device is enclosed by a multilayer protective covering in accordance with an embodiment of the invention.

Referring to FIG. 1, a device package too includes a device 117 disposed on substrate 110. In one embodiment, the device 117 is attached to substrate 110 by way of an intervening interface structure 113. The substrate too may be any suitable substrate used as a carrier. For example, substrate 110 may be a metal, ceramic, glass, or semiconductor substrate. In one embodiment, the substrate 110 is a printed circuit board including a laminate material. The printed circuit board may include multiple laminate layers and conductive layers to provide mechanical support and electrical connectivity for device 117 as well as other devices. The substrate 110 may include additional contact pads, connectors, through vias, ground planes, conductive traces, redistribution layers, surface mounted devices, embedded and/or integrated devices, and electric circuits.

In various embodiments, interface structure 113 may be a patterned conductive layer such as one or more contact pads, a conductive adhesive, a ball grid array, or an array of conductive pillars. The interface structure 113 may include a conductive material such as a metal. In one embodiment, the interface structure 113 includes copper (Cu). In various embodiments, the interface structure 113 includes gold (Au), aluminum (Al), tin (Sn), lead (Pb), nickel (Ni), palladium (Pd), and/or the like.

In some embodiments, the interface structure 113 may comprise non-conductive materials such as an epoxy resin, for example. Alternatively, the interface structure 113 may be replaced with an entirely non-conductive interface and all connections may be made using wire bonds or other suitable means.

The device 117 may be any type of device. Possible devices may include microelectromechanical systems (MEMS) devices, semiconductor circuits, electromagnetic devices, electrochemical devices, and the like. In various embodiments, device 117 may include integrated devices as well as discrete components. In one embodiment, device 117 is an integrated circuit chip that includes integrated semiconductor devices. In various embodiments, device 117 includes a sensor. In various embodiments, device 117 includes a MEMS sensor and is a silicon microphone (SiMIC) in one embodiment.

Device 117 may be packaged, partially packaged, or may be unpackaged as in a bare die. In one embodiment, device 117 is mechanically and electrically coupled to substrate 110 using the interface structure 113. In an alternative embodiment, device 117 is mechanically coupled to substrate 110 using the interface structure 113 and electrically coupled to substrate 110 using other means such as wire bonding, a ball grid array, flip chip configuration, and the like. Many other suitable mechanisms of mechanical coupling and electrical coupling exist in the art and the invention is not limited to those explicitly disclosed herein.

The operation and longevity of device 117 may be affected by environmental conditions such as changes in temperature and electromagnetic interference. Device 117 may also be affected by physical or electrical contact with other objects. In one embodiment, the operation of device 117 is adversely affected by changes in temperature. In this and other embodiments, devices susceptible to outside influences may be referred to as being "sensitive" to certain conditions. For example, a device affected by elevated temperatures may be referred to as being sensitive to elevated temperatures and so on.

Still referring to FIG. 1, the device package 100 includes a multilayer protective covering 120 that is attached to substrate 110 using interface structure 113. The multilayer protective covering 120 in combination with substrate 110 encloses device 117. Multiplayer protective covering 120 may provide protection to device 117 from outside influences. In some cases, a void 112 may exist between device 117 and multilayer protective covering 120. The void 112 may be filled with a gas such as air, nitrogen ($N_2$), and argon (Ar) or may be a vacuum. The void may advantageously provide a level of protection to device 117 from physical and thermal influences occurring outside the multilayer protective covering 120.

The multilayer protective covering 120 includes a core layer 132 and an electrically conductive layer 142.

The core layer 132 may include a mechanically stable material. In various embodiments, the core layer 132 is a metal and is brass in one embodiment. The specific alloy of the brass core layer may be chosen to improve the mechanical properties of the multilayer protective covering 120. For instance, a brass core layer may be a higher zinc content alloy such as having 30% zinc, and about 70% copper. In general, any type of brass comprising a good mechanical tensile strength and toughness suitable for packaging may be used. Being a thick layer, the core layer 132 may comprise less of expensive metals such as silver or copper while having more of less expensive metals such as zinc. Accordingly, in other embodiments, the core layer 132 may include other metals such as iron alloys such as stainless steel.

In another embodiment, the core layer 132 is nickel silver. It should be noted that nickel silver typically refers to an alloy of copper and nickel and does not contain elemental silver. For this and other embodiments, nickel silver will refer to the common alloy including elemental copper and nickel and does not refer to an alloy including silver (Ag). Nickel silver may also include other metals such as zinc. For example, a nickel silver core layer may include 60% copper, 20% nickel, and 20% zinc (CuNi20Zn20). Variations of nickel silver may also be referred to by other names including German silver and nickel brass.

As mentioned above, the material of the core layer 132 may have a lower electrical conductivity than the material of the electrically conductive layer 142. In various embodiments, the core layer 132 has an electrical conductivity between zero and 20 MS/m. In one embodiment, the core layer 132 has an electrical conductivity of about 15 MS/m. In another embodiment, the core layer 132 has an electrical conductivity of about 5 MS/m.

In various embodiments, the electrically conductive layer 142 is substantially a pure metal and is copper (Cu) in one embodiment. In other embodiments, the electrically conductive layer 142 includes other materials such as silver. In further embodiments, the electrically conductive layer 142 is a high conductivity alloy of copper such as 95% copper and less than or equal to 5% zinc such as 5% zinc, e.g., 0.1% to 5% zinc. The electrically conductive layer 142 may be a homogeneous material or may include multiple materials in any configuration. For example, electrically conductive layer 142 may be a multilayer material. Alternatively or additionally, electrically conductive layer 142 may be a structured material including various regions of multiple materials.

The material of the electrically conductive layer 142 may be chosen to have a higher electrical conductivity than the material of the core layer 132. In various embodiments, the electrically conductive layer 142 has an electrical conductivity between 30 MS/m ($10^6$ Siemens per meter) and 65 MS/m. In one embodiment, the electrically conductive layer 142 has an electrical conductivity of about 58 MS/m. In another embodiment, the electrically conductive layer 142 has an electrical conductivity of about 33 MS/m. In still another embodiment, the electrically conductive layer 142 has an electrical conductivity of about 63 MS/m.

In various embodiments, the electrical conductivity of the electrically conductive layer 142 is greater than the core layer 132 by about 20% to 400%. In one embodiment, the electrical conductivity of the electrically conductive layer 142 is greater than the core layer 132 by about 200% to about 300%.

The multilayer protective covering 120 may be advantageously configured such that a substantial part or all of the electrical current that flows through multilayer protective covering 120 flows only through the electrically conductive layer 142. Accordingly, the thickness of the electrically conductive layer 142 is designed to be at least three times the skin depth of the material of the electrically conductive layer 142. For example, in various embodiments, the thickness of the electrically conductive layer 142 is three to five times the skin depth.

Electric currents flowing in multilayer protective covering 12o may be induced for example, by magnetic fields due to radio frequency signals, for example. Because the electrically conductive layer 142 carries most or all of the electric current other constituent layers in the multilayer protective covering 12o may not be required to be electrically conductive. In some embodiments, the core layer may include an electric insulator such as a thermoplastic, glass, hard rubber, and the like.

Again referring to FIG. 1, an outer surface layer 152 and an inner surface layer 154 are disposed on outer and inner surfaces of the multilayer protective covering 120 in some embodiments. The outer surface layer 152 and inner surface layer 154 may provide additional protection such as corrosion and chemical resistance as well as being a favorable surface for soldering. The outer surface layer 152 and inner surface layer 154 may include a metal and are nickel phosphorus (NiP) in one embodiment. Nickel phosphorus surface layers may provide the benefit of being nonmagnetic, especially in the case of greater than 11.2% phosphorus content. In various embodiments, increased benefit may be obtained by using such nonmagnetic nickel phosphorus layers. In one embodiment, the outer surface layer 152 and inner surface layer 154 include nickel with 13% phosphorus content. In other embodiments, outer surface layer 152 and inner surface layer 154 include nickel with greater than 13% phosphorus content. Alternatively, outer surface layer 152 and inner surface layer 154 may include nickel with less than or equal to 11.2% phosphorus content. In one embodiment, phosphorus is omitted entirely from outer surface layer 152 and inner surface layer 154.

Figure 2:
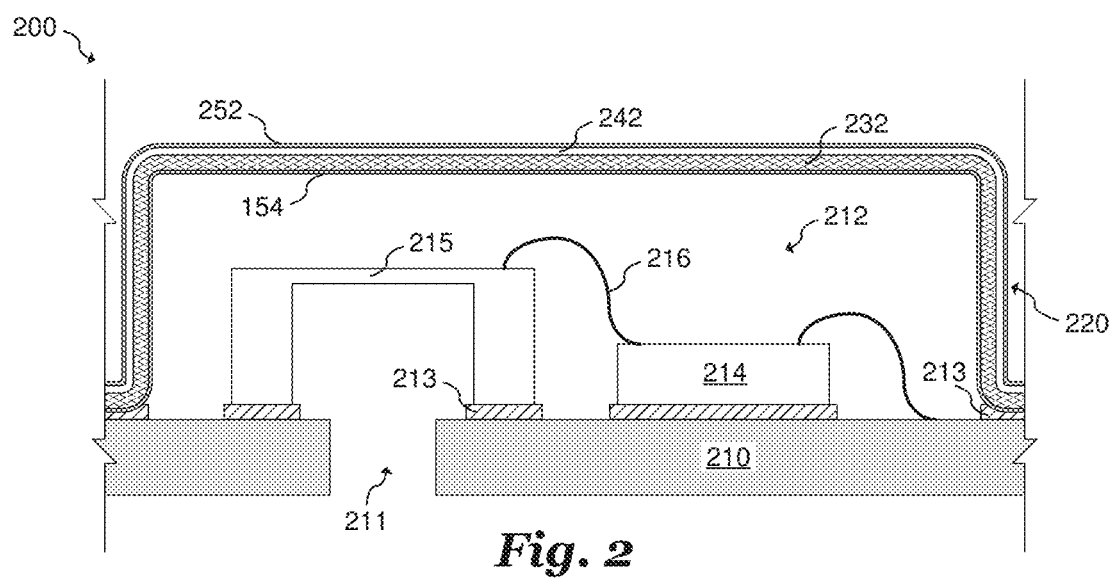
FIG. 2 illustrates an example device package in which a sensor and an integrated circuit chip are enclosed by a multilayer protective covering in accordance with an embodiment of the invention.

FIG. 2 illustrates an example device package in which a sensor and an integrated circuit chip are enclosed by a multilayer protective covering in accordance with an embodiment of the invention.

Another embodiment of the present invention is shown in FIG. 2. Like numerals are used for the various elements that were described in FIG. 1. To avoid repetition, each reference number shown in FIG. 2 is not described again in detail herein. Rather, similar materials x10, x12, x13, x20, etc. . . . are preferably used for the various elements shown as were described for FIG. 1, where x=1 in FIG. 1 and x=2 in FIG. 2. A similar numbering methodology has been adopted for FIGS. 3-8.

Referring to FIG. 2, a device package 200 includes an integrated circuit chip 214 and a sensor 215 disposed on a substrate 210. A multilayer protective covering 22o is attached to substrate 210 such that the integrated circuit chip 214 and the sensor 215 are enclosed by the combination of the multilayer protective covering 220 and the substrate 210. The multilayer protective covering 220, integrated circuit chip 214, and sensor 215 may be attached to substrate 210 using an interface structure 213. The substrate 210 may be any suitable substrate and may be similar in composition to substrate 110 of FIG. 1. Additionally, interface structure 213 may be similar in configuration to interface structure 113 of FIG. 1. Multilayer protective covering 220 includes a core layer 232, electrically conductive layer 242, and optionally includes outer surface layer 252 and inner surface layer 254. Multilayer protective covering 22o may be similar in configuration and composition to multilayer protective covering 120 described in reference to FIG. 1.

The integrated circuit chip 214 may include a semiconductor substrate containing active and passive devices, metal layers, dielectric layers, doped and intrinsic semiconductor regions, and redistribution layers (RDLs) as well as other components known in the art. The integrated circuit chip 214 may include a microprocessor, application-specific integrated circuit (ASIC), a field-programmable gate array (FPGA), and the like. The integrated circuit chip 214 may be packaged, partially packaged, or unpackaged as in a bare die. In various embodiments, integrated circuit chip 214 is configured to process signals from sensor 215 and is configured to interface with other devices outside device package 200.

The sensor 215 may be any type of sensor and is an acoustic transducer in various embodiments. In one embodiment, sensor 215 is a MEMS microphone, which is a type of acoustic transducer. In other embodiments the sensor may be a chemical sensor, a humidity sensor, a motion sensor, and the like. The sensor 215 may be configured to be spaced apart from multilayer protective covering 220 by a void 212. For specific applications, such as for acoustic transducers, the void 212 may be referred to as a back volume and may be configured to be a specific size and shape depending on operational parameters of the acoustic transducer.

In certain applications such as gas sensing and acoustic transduction, sensor 215 may interact with the environment outside of device package 200 during operation. An opening 211 is included below sensor 215 to allow sensor 215 to interact with the environment outside of the device package 200. For example, for the scenario in which sensor 215 is a MEMS microphone, sound waves propagating through air outside of the device package 200 travel through opening 211 to sensor 215. It should be noted that opening 211 may be a hole of any suitable shape and size in substrate 210. FIG. 2 depicts a cross-sectional view of device package 200o and therefore does not show sidewalls of opening 211 that may be outside the plane of the drawing.

It should be noted that the opening 211 may also be located in other parts of device package 200. For example, in one embodiment, opening 211 is included in multilayer protective covering 220. In other embodiments, additional openings may be included in both substrate 210 and multilayer protective covering 22o. The location and number of openings is not limited to specific embodiments described herein as other suitable arrangements may be apparent to one of ordinary skill in the art.

Integrated circuit chip 214 and sensor 215 may be electrically coupled to one another and/or the substrate 210 using interconnects 216 such as wire bonds in one embodiment. The use of interconnects 216 may be enabled by the inclusion of void 212 so that the multilayer protective covering 220 does not make physical contact with wire bond interconnects 216. For ease of comprehension, only two wire bond interconnects 216 are shown in FIG. 2 although many more may be included in device package 200. Alternatively, other methods of electrical coupling may also be used such as those described in reference to FIG. 1.

Figure 3A:
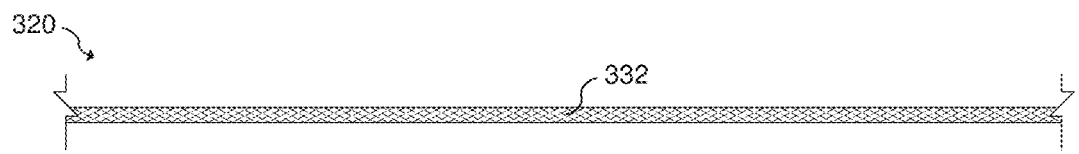
FIGS. 3A-3D illustrate an example multilayer protective covering in accordance with an embodiment of the invention.
Figure 3B:
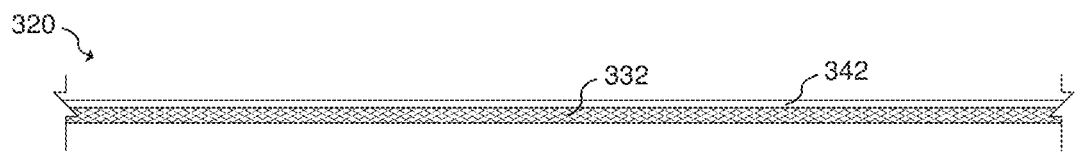
Figure 3C:
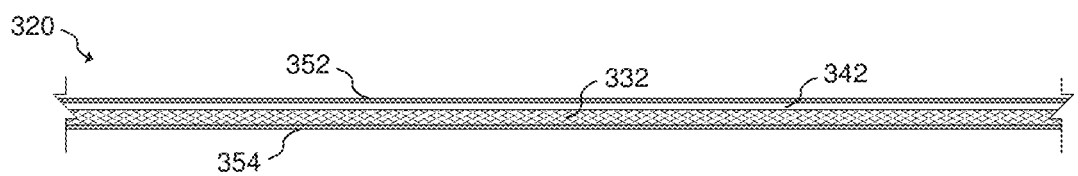
Figure 3D:
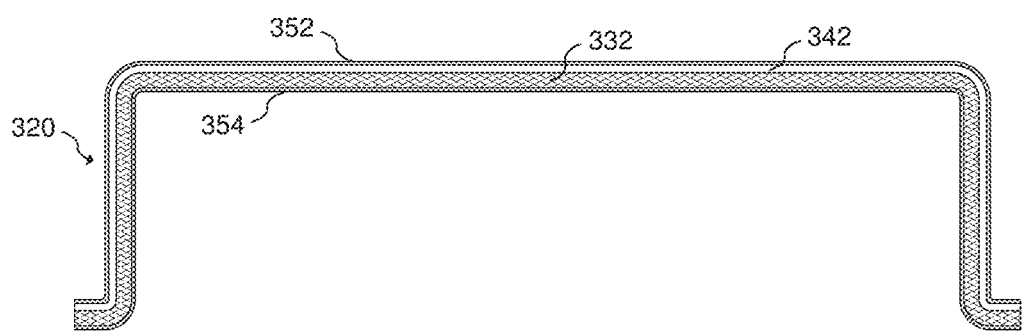

FIGS. 3A-3D illustrate an example multilayer protective covering in accordance with an embodiment of the invention, FIG. 3A illustrates a core layer of the multilayer protective covering, FIG. 3B illustrates the multilayer protective covering after forming an electrically conductive layer on the core layer, FIG. 3C illustrates the multilayer protective covering after forming an outer surface layer and an inner surface layer on the electrically conductive layer and the core layer respectively, and FIG. 3D illustrates the multilayer protective covering after shaping the multilayer protective covering.

Referring to FIGS. 3A and 3B, a multilayer protective covering 320 includes a core layer 332. An electrically conductive layer 342 is formed on the core layer 332. The electrically conductive layer may be formed using any suitable technique. For example, the electrically conductive layer 342 may be formed using electroplating or chemical (electroless) plating methods as are known in the art. In alternative embodiments, the electrically conductive layer 342 may be formed using deposition processes such as chemical vapor deposition, plasma vapor deposition, sputtering, and others. Alternatively, the electrically conductive layer 342 may be formed by laminating the electrically conductive layer 342 to a surface of the core layer 332. In some embodiments, the electrically conductive layer 342 may be formed on both sides of the core layer 332. The electrically conductive layer 342 and the core layer 332 may have a similar composition to the electrically conductive layer 142 and the core layer 132 of FIG. 1 respectively.

Referring now to FIG. 3C, an outer surface layer 352 and an inner surface layer 354 are optionally formed on respective exposed surfaces of electrically conductive layer 342 and core layer 332. Outer surface layer 352 and inner surface layer 354 may be similar in composition to outer surface layer 152 and inner surface layer 154 of FIG. 1 and may be formed using known plating techniques. For example, in the case that the outer surface layer 352 and inner surface layer 354 include nickel phosphorus (NiP), an electroless plating method may be used to plate the core layer 332. Electroless plating of nickel phosphorus may have the additional benefit of being compatible with nonmetal materials. This may be particularly useful in applications where the exposed surface of core layer 332 is a nonmetal or where an intervening nonmetal layer is formed between core layer 332 and inner surface layer 354.

Referring to FIG. 3D, the multilayer protective covering 320 is drawn, stamped, trimmed, or otherwise worked to form a predetermined shape. The multilayer protective covering 320 may be annealed, quenched, or otherwise heat-treated after the shaping in various embodiments. The predetermined shape may be based on a variety of factors and may be based on design parameters for a given application. A cross-sectional view of multilayer protective covering 320 is shown in FIG. 3D. As shown, multilayer protective covering 320 has rounded corners, but this does not have to be the case. Similarly, the substantially rectangular cross-section of multilayer protective covering 320 may be any suitable shape in other embodiments. Further, from a top view, multilayer protective covering 320 may be substantially circular, substantially square, or any other conceivable shape. The physical shape of multilayer protective covering 320 may be based on the number, size, and orientation of devices that are to be enclosed by multilayer protective covering 320. In all cases, however, the shape comprises a central cavity, opening, or recess so as to form a cup-shaped structure that forms a protective housing for the devices to be protected.

Figure 4A:
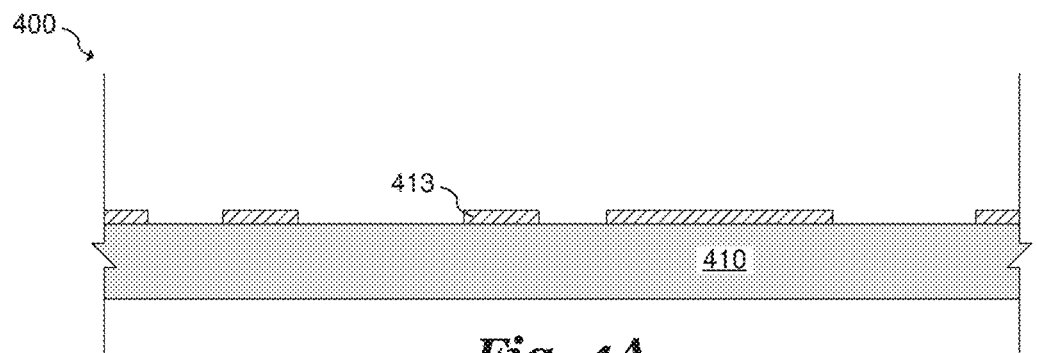
FIGS. 4A-4D illustrate an example device package in which a sensor and an integrated circuit chip are attached to a substrate in accordance with an embodiment of the invention.
Figure 4B:
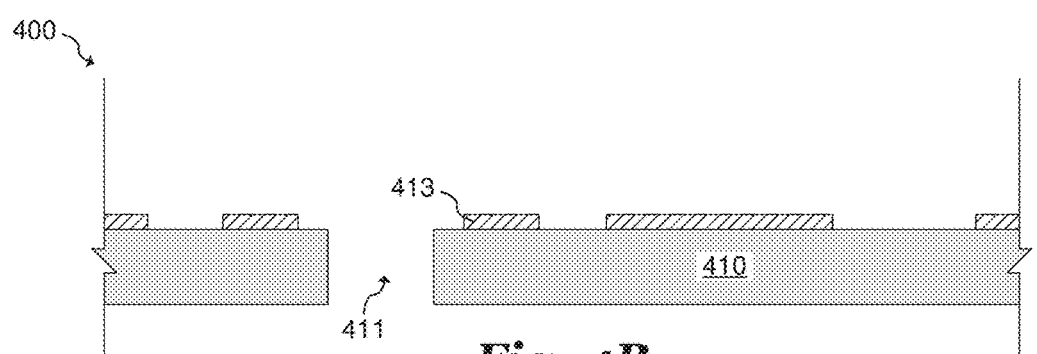
Figure 4C:
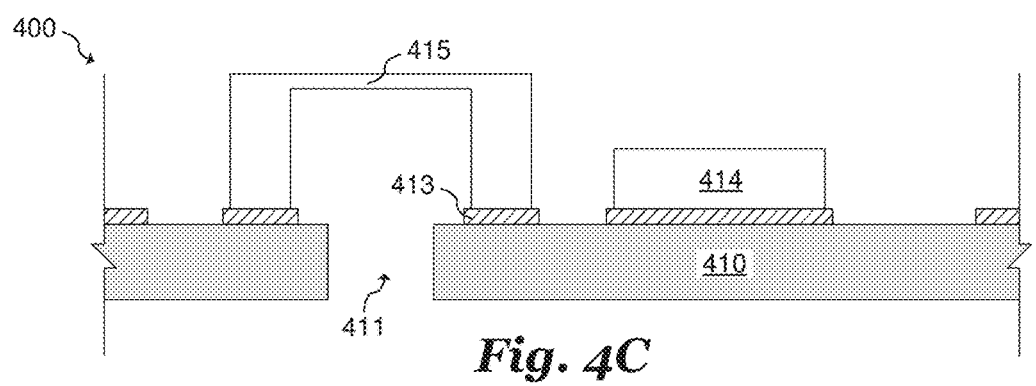
Figure 4D:
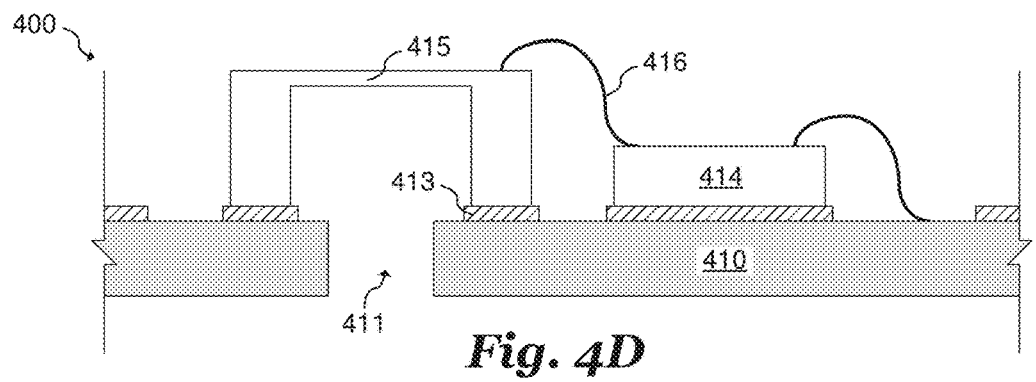

FIGS. 4A-4D illustrate an example device package in which a sensor and an integrated circuit chip are attached to a substrate in accordance with an embodiment of the invention, FIG. 4A illustrates the device package after forming conductive pads on the substrate, FIG. 4B illustrates the device package after forming an opening in the substrate, FIG. 4C illustrates the device package after attaching a sensor and an integrated circuit chip to the conductive pads on the substrate, and FIG. 4D illustrates the device package after forming electrical connections to the sensor and the integrated circuit chip using wire bonds.

Referring to FIG. 4A, a device package 400 includes an interface structure 413 formed on a substrate 410o. The interface structure 413 and substrate 410 may be similar in configuration and composition to interface structure 113 and substrate 110 of FIG. 1. The interface structure 413 may be formed by lithographic patterning, screen printing, or the like. In some cases, interface structure 413 may contain multiple types of conductive interface such as contact pads in conjunction with a ball grid array.

Referring now to FIGS. 4B and 4C, an opening 411 is formed in substrate 410. The opening 411 may be formed by drilling, water jet, laser cutting techniques, and the like. The opening 411 may be similar in configuration to opening 211 of FIG. 2. An integrated circuit chip 414 and a sensor 415 may then be attached to the substrate 410 using the interface structure 413. In various embodiments, attaching the integrated circuit chip 414 and the sensor 415 includes a solder reflow process. In one embodiment, the integrated circuit chip 414 and/or the sensor 415 is attached to the interface structure 413 using a conductive or nonconductive adhesive.

Referring to FIG. 4D, electrical coupling of integrated circuit chip 414 and sensor 415 is implemented using wire bond interconnects 416. As previously described, electrical coupling of integrated circuit chip 414 and sensor 415 are not limited to wire bond interconnects 416 and other methods of providing electrical coupling may be used. Additionally, interface structure 413 may be omitted beneath the integrated circuit chip 414 and/or sensor 415 and all electrical coupled may be made using wire bond interconnects 416 or any other suitable connections. In this case a nonconductive adhesive may be used instead of interface structure 413.

Figure 5:
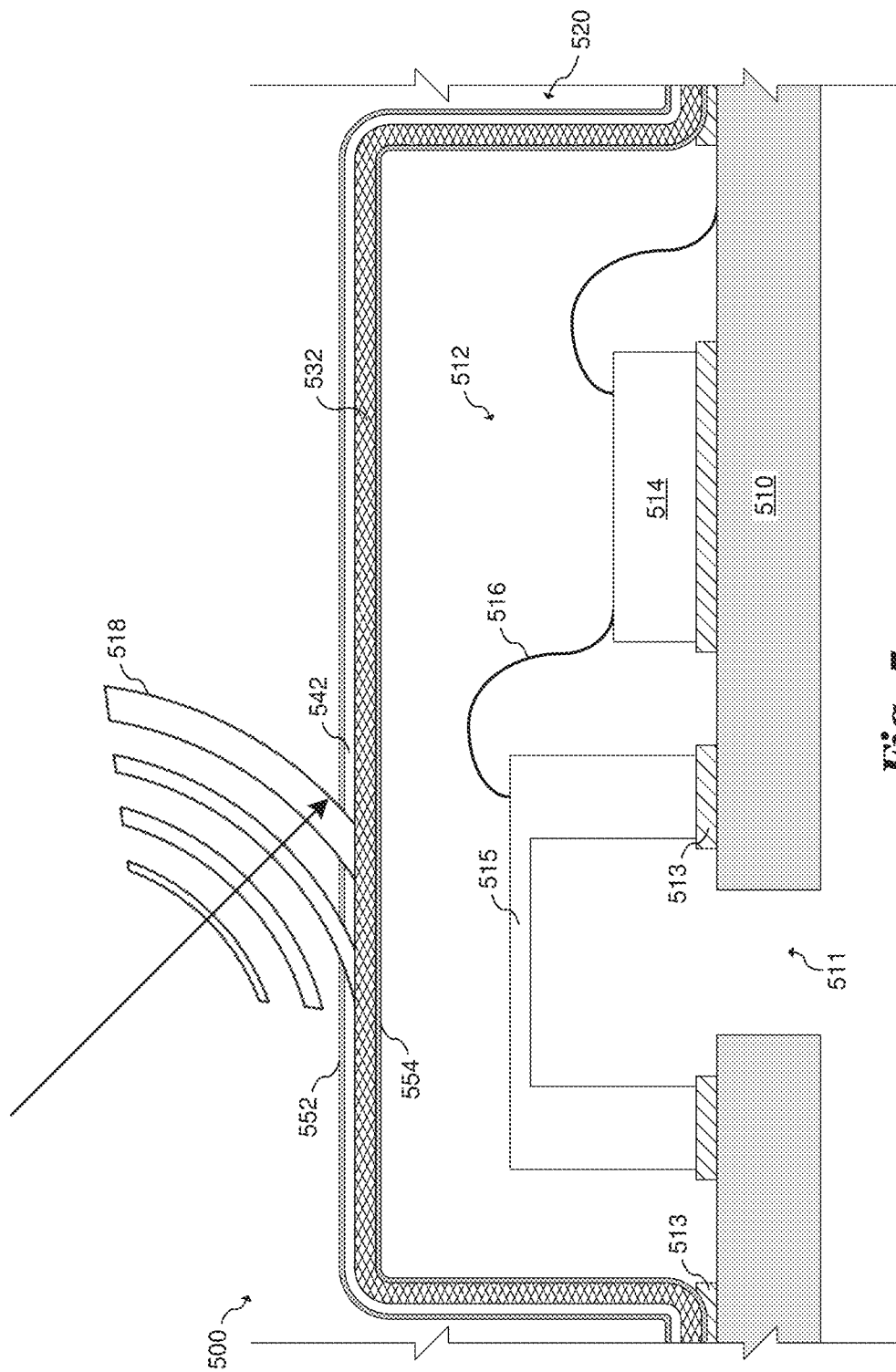
FIG. 5 illustrates an example device package in which a sensor and an integrated circuit chip are enclosed by a multilayer protective covering after attaching the multilayer protective covering to conductive pads on a substrate in accordance with an embodiment of the invention.

FIG. 5 illustrates an example device package in which a sensor and an integrated circuit chip are enclosed by a multilayer protective covering after attaching the multilayer protective covering to conductive pads on a substrate in accordance with an embodiment of the invention.

Referring to FIG. 5, a device package 500 includes a multilayer protective covering 520 that is attached to a substrate 510 including an integrated circuit chip 514 and a sensor 515. The device package 500 may be similar in composition and configuration to device package too of FIG. 1 and may be formed using a method similar to device package 400 of FIG. 4. The multilayer protective covering 520 may be attached to substrate 510 using interface structure 513 or other suitable means. As previously described in reference to FIG. 1 and as shown in FIG. 5, multilayer protective covering 520 may be positioned on a surface of substrate 510 such that integrated circuit chip 514 and sensor 515 are enclosed by multilayer protective covering 520 and the substrate 510.

FIG. 5 shows a radio frequency signal 518 that is incident on the multilayer protective covering 520. The radio frequency signal 518 may be generated in a nearby radio frequency device. The radio frequency signal 518 may also be other types of electromagnetic radiation and is not limited to the radio frequency range. In various embodiments, the multilayer protective covering 520 is configured to absorb, reflect, or otherwise affect the propagation of radio frequency signal 518 so that it does not reach the interior of device package 500. Specifically, integrated circuit chip 514 and sensor 515 are protected from outside electromagnetic radiation by multilayer protective covering 520.

As shown in FIG. 5, effects of radio frequency signal 518 such as induced electrical currents may not penetrate into core layer 532. For example, all electrical currents induced by radio frequency signal 518 in multilayer protective covering 520 may be conducted and dissipated by electrically conductive layer 542 and outer surface layer 552. In one embodiment, a majority of the induced electric current flows in electrically conductive layer 542. In one embodiment, less than 1% of the induced electric current flows in core layer 532.

For the scenario in which electrically conductive layer 542 has higher electrical conductivity than core layer 532, radio frequency losses may be advantageously reduced compared to a protective covering implemented using only a core layer. This may be a result of lower resistance to electrical current flow in electrically conductive layer 542 compared to a high electrical resistance in core layer 532. Reduced radio frequency losses may have the benefit of converting less electromagnetic energy to thermal energy which beneficially generates less heat in multilayer protective covering 520 and therefore less heat within device package 500.

Figure 6A:
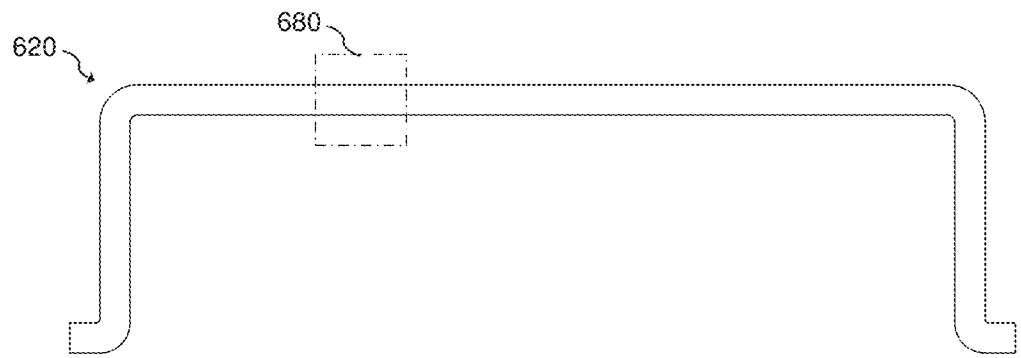
FIGS. 6A-6E illustrate various example multilayer protective coverings in accordance with embodiments of the invention.
Figure 6B:
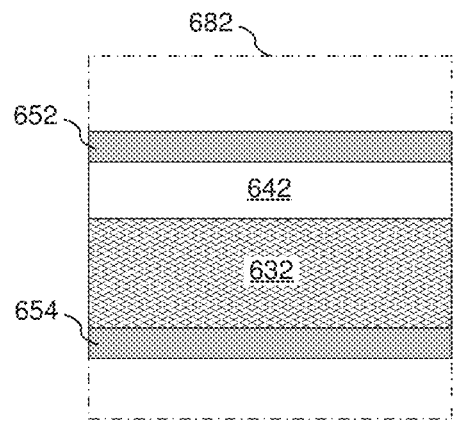
Figure 6C:
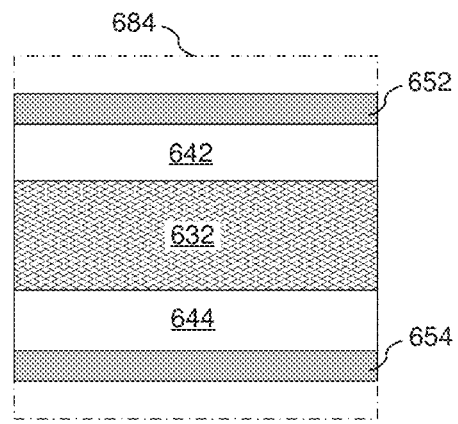
Figure 6D:
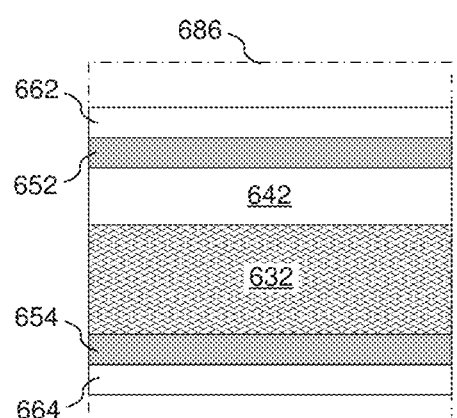
Figure 6E:
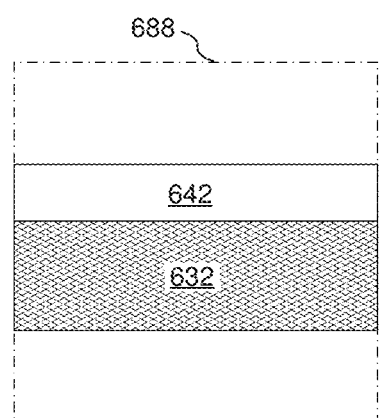

FIGS. 6A-6E illustrate various example multilayer protective coverings in accordance with embodiments of the invention, FIG. 6A illustrates an example multilayer protective covering in which a segment of the multilayer protective covering is indicated, FIG. 6B illustrates an example structure of the multilayer protective covering, FIG. 6C illustrates another example structure of the multilayer protective covering, FIG. 6D illustrates yet another example structure of the multilayer protective covering, and FIG. 6E illustrates still another example structure of the multilayer protective covering.

Referring to FIG. 6A, a multilayer protective covering 620 is illustrated with a representative segment 620 of the multilayer protective covering 620 indicated with a box. Multilayer protective covering 620 is assumed to be of substantially constant composition in all areas including representative segment 68o, although this may not be the case in other embodiments. Several embodiment structures of multilayer protective covering 620 are illustrated in FIGS. 6B-6E using magnified view of representative segments. Each of the representative segments depicted in FIGS. 6B-6E may be a specific implementation of representative segment 68o and the layer structure of multilayer protective covering 620.

Referring now to FIG. 6B, a representative segment 682 of a multilayer protective covering includes a core layer 632, an electrically conductive layer 642, an outer surface layer 652, and an inner surface layer 654. The structure of representative segment 682 may be similar to the structure of multiplayer protective coverings of previous embodiments such as in FIGS. 1-3 and 5, for example. The core layer 632, electrically conductive layer 642, outer surface layer 652, and inner surface layer 654 may be similar to corresponding layers of FIG. 1.

It should be noted that the inclusion of outer surface layer 652 and inner surface layer 654 may be based on choices of materials for the core layer 632 and the electrically conductive layer 642. Consequently, in some embodiments, either of the outer surface layer 652 or the inner surface layer 654 may be omitted. For example, in some cases the surface layers may be included to protect the multilayer protective covering from corrosion and other chemical reactions. However, if either of the core material 632 and the electrically conductive material 642 are sufficiently chemically resistant then one or both of the surface layers may not be needed. Alternatively, the multilayer protective covering may be used in an application where contact with chemicals is unlikely resulting in the omission of one or both surface layers.

Referring to FIG. 6C, another representative segment 684 includes an inner electrically conductive layer 644 between core layer 632 and inner surface layer 654. Inner electrically conductive layer 644 may be similar in configuration and composition to electrically conductive layer 642, but is not required to be identical to electrically conductive layer 642. For example, the electrical properties of inner conductive layer 644 may be chosen based on different criteria than the electrically conductive layer 642. Alternatively, an electrically conductive layer 642 and an inner electrically conductive layer 644 that are identical may be incorporated on either side of the core layer 632. This has the possible advantage of reducing the overall thickness of the multilayer protective covering to while achieving similar performance characteristics as the structure of FIG. 6B.

Referring to FIG. 6D, yet another representative segment 686 includes a second outer surface layer 662 and a second inner surface layer 664. Second outer surface layer 662 and second inner surface layer 664 may include a conductive material in various embodiments and may include gold (Au) in one embodiment. A second surface layer on the inner and outer surfaces of a multilayer protective covering may advantageously provide further corrosion and chemical resistance maintaining solderability of underlying outer surface layer 652 and inner surface layer 654.

For embodiments in which outer surface layer 652 and inner surface layer 654 are nickel phosphorus while second outer surface layer 672 and second inner surface layer 754 are gold (Ag), the surface layers may be referred to as an electroless nickel immersion gold (ENIG) finish. Methods of applying an ENIG finish are well known in the art. Optionally, an additional palladium (Pd) layer may be plated onto exposed surfaces of nickel phosphorus before applying the immersion gold. Such a modified ENIG finish may be referred to as an electroless nickel electroless palladium immersion gold (ENEPIG) finish and is well known in the art.

In various embodiments, thicknesses of second outer surface layer 662 and second inner surface layer 664 may be smaller than respective thicknesses of the outer surface layer 652 and inner surface layer 654. Similar to outer surface layer 652 and inner surface layer 654, either of the second outer surface layer 662 and second inner surface layer 664 may be omitted due to material choices or omissions of other layers in the multilayer protective covering structure.

Referring now to FIG. 6E, still another representative segment 688 includes only a core layer 632 and an electrically conductive layer 642. Such a structure might be used in applications where harsh environmental conditions are unlikely to occur and where size and weight of the multilayer protective covering are a primary design concern.

Figure 7:
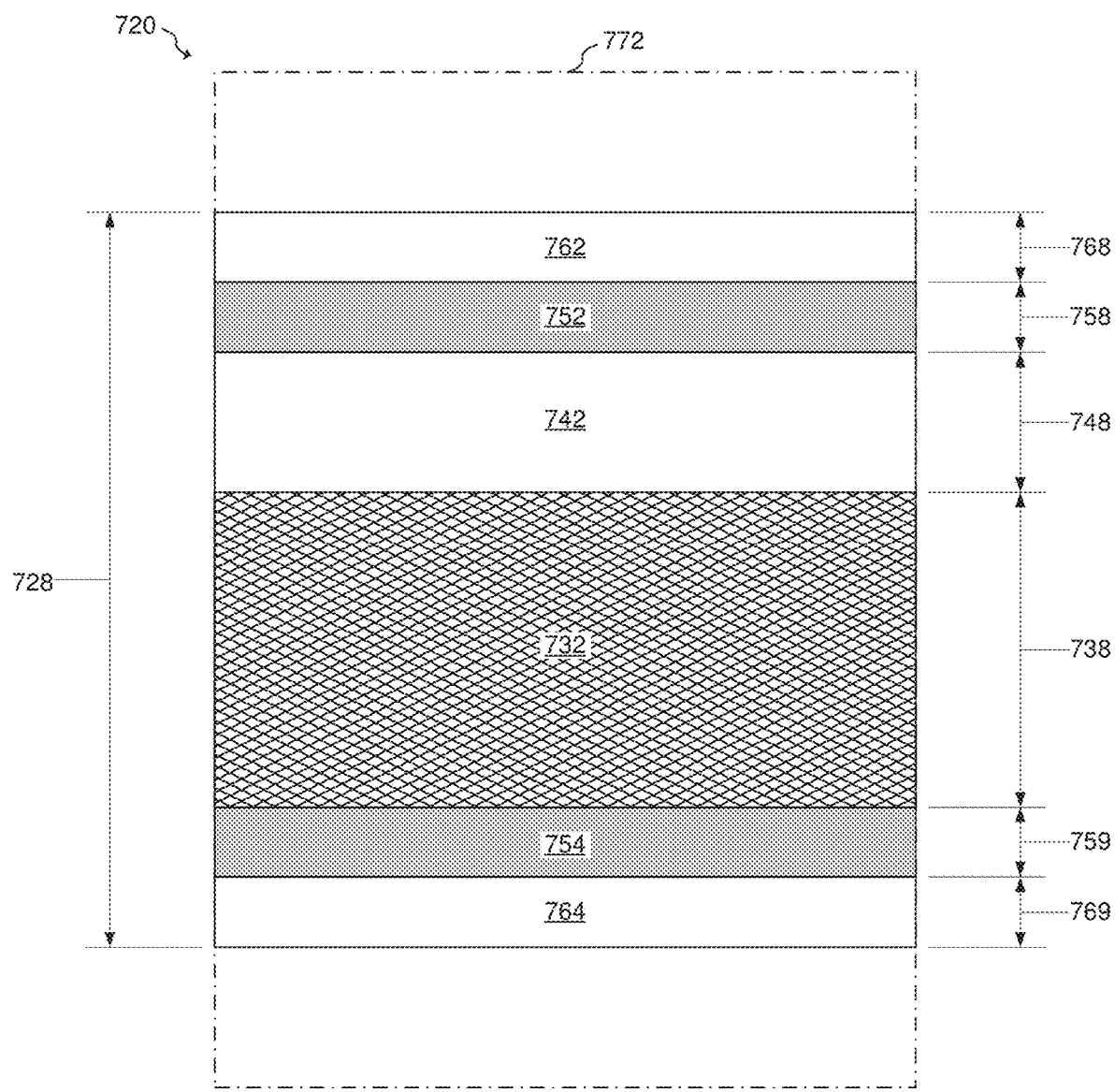
FIG. 7 illustrates an example multilayer protective covering in which representative dimensions are indicated in accordance with an embodiment of the invention.

FIG. 7 illustrates an example multilayer protective covering in which representative dimensions are indicated in accordance with an embodiment of the invention.

Referring to FIG. 7, a multilayer protective covering 720 includes a representative segment 772 with a structure that includes a core layer 732, an electrically conductive layer 742, an outer surface layer 752 and a second outer surface layer 762, and an inner surface layer 754 and a second inner surface layer 764. In various embodiments, multilayer protective covering 72o has a substantially constant composition and is consistent with the composition of representative segment 772. In other embodiments, different segments of multilayer protective covering 720 may have different composition compared to representative segment 772.

The core layer 732 may have a similar composition and configuration as core layer 132 of FIG. 1. In some cases, core layer 732 may provide most or all of the mechanical stability of multilayer protective covering 720. In various embodiments, core layer 732 has a core layer thickness 738 between 50 μm and 500 μm. In one embodiment, the core layer thickness 738 is about 100 μm. For example, in one embodiment, the core layer 732 may include nickel silver such as 60% copper, 20% nickel, and 20% zinc (CuNi20Zn20) and may include tin, and manganese. In various embodiments, the core layer 732 may be 75 μm thick.

Since multilayer protective covering 720 may be configured such that induced electric current does not flow through core layer 732, core layer thickness 738 may advantageously be made thinner. For example, some materials having good mechanical stability have lower electrical conductivity. In order to compensate, such materials may be made thicker to increase the cross sectional area which may increase conductance. However, when multilayer protective covering 720 is configured so that no electric current flows in core layer 732, there may be no need to increase core layer thickness 738 based on conductance requirements. As a result, core layer thickness 738 may be based on other factors such as mechanical stability. A general guideline might be that core layer thickness 738 may be made thinner when core layer 732 includes materials with higher mechanical stability.

Other considerations that may influence the choice of material of core layer 732 may be thermal properties, weight, cost, and ease of manufacturing. Advantageously, the material of core layer 732 may be chosen more freely due to the relaxing of design constraints involving electrical properties. As another possible benefit, multilayer protective covering 732 may also perform better in a variety of categories including electrical properties, mechanical stability, and size as well as being simpler and cheaper to manufacture.

Referring again to FIG. 7, electrically conductive layer 742 may be similar in composition and configuration to electrically conductive layer 142 of FIG. 1. The electrically conductive layer 742 may be configured to conduct most or all electric current that flows through multilayer protective covering 720. In various embodiments, electrically conductive layer 742 has an electrically conductive layer thickness 748 that is between 3 μm and 15 μm. In one embodiment, the electrically conductive layer thickness 748 is about 6 μm. In another embodiment, the electrically conductive layer thickness 748 is about 10 μm. For example, in one embodiment, the electrically conductive layer 742 may include copper and the electrically conductive layer 742 may be about 6 μm. In another embodiment, electrically conductive layer 742 may include brass such as 95% copper, 5% zinc (CuZn5) and the electrically conductive layer thickness 748 may be about 10 μm. Alternatively, electrically conductive layer 742 including CuZn5 brass may have an electrically conductive layer thickness 748 of about 6 μm. In still another embodiment, electrically conductive layer 742 may include silver (Ag) and the electrically conductive layer thickness 748 may be about 5 μm.

For some applications it may be important for multilayer protective covering 72o to be resistant to corrosion and other chemical reactions. Outer surface layer 752 and inner surface layer 754 may provide resistance to corrosion and chemical reactions among other uses. Outer surface layer 752 and inner surface layer 754 may be similar in composition and configuration to outer surface layer 152 and inner surface layer 154 of FIG. 1. Outer surface layer 752 and inner surface layer 754 have an outer surface layer thickness 758 and an inner surface layer thickness 759 respectively. In various embodiments, outer surface layer thickness 758 and inner surface layer thickness 759 are substantially identical and are between 0.2 μm and 5 μm. In some embodiments, outer surface layer thickness 758 and inner surface layer thickness 759 are between 1 μm and 3 μm. In one embodiment, outer surface layer thickness 758 and inner surface layer thickness 759 are both about 1.5 μm. In other embodiments, outer surface layer thickness 758 may be a different value than inner surface layer thickness 759. There is no limitation that outer surface layer 752 must have the same parameters as inner surface layer 754.

Still referring to FIG. 7, second outer surface layer 762 and second inner surface layer 764 may be similar in composition and configuration to second outer surface layer 662 and second inner surface layer 664 of FIG. 6. Second outer surface layer 762 and second inner surface layer 764 have a second outer surface layer thickness 768 and a second inner surface layer thickness 769 respectively. In various embodiments, second outer surface layer thickness 768 and second inner surface layer thickness 769 are substantially identical and are between 50 nm and 200 nm. In one embodiment, second outer surface layer thickness 768 and second inner surface layer thickness 769 are both about 100 nm. As with earlier surface layers, there is no limitation that second outer surface layer 762 must have identical parameters as second inner surface layer 764.

Figure 8A:
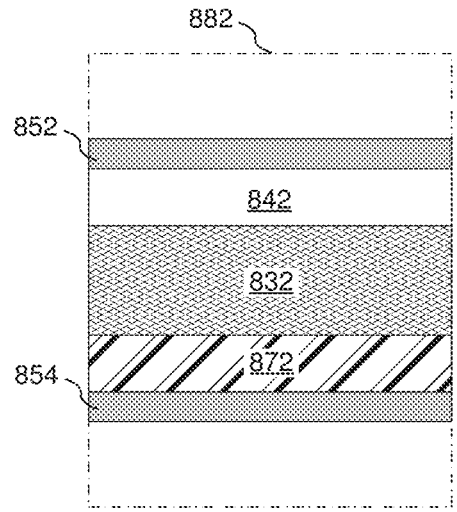
FIGS. 8A-8D illustrate various example multilayer protective coverings in accordance with embodiments of the invention.
Figure 8B:
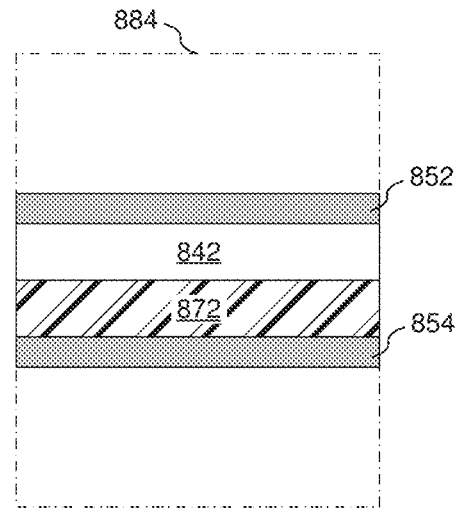
Figure 8C:
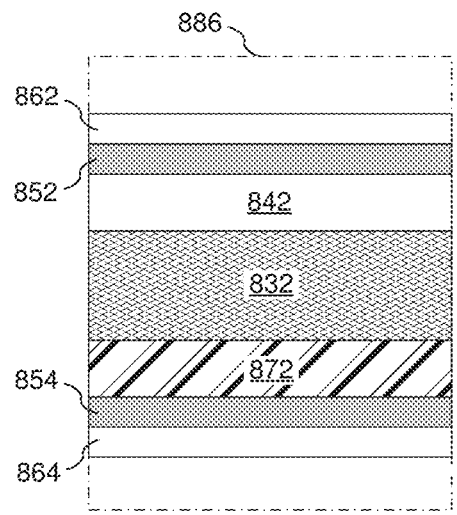
Figure 8D:
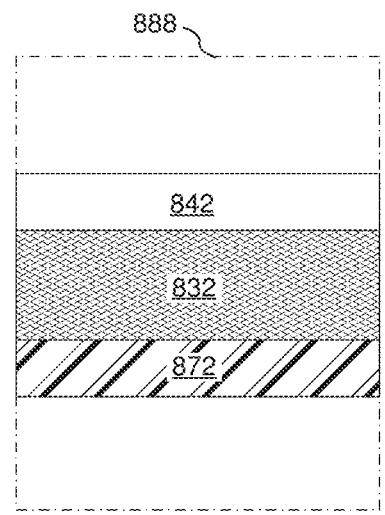
Figure 9:
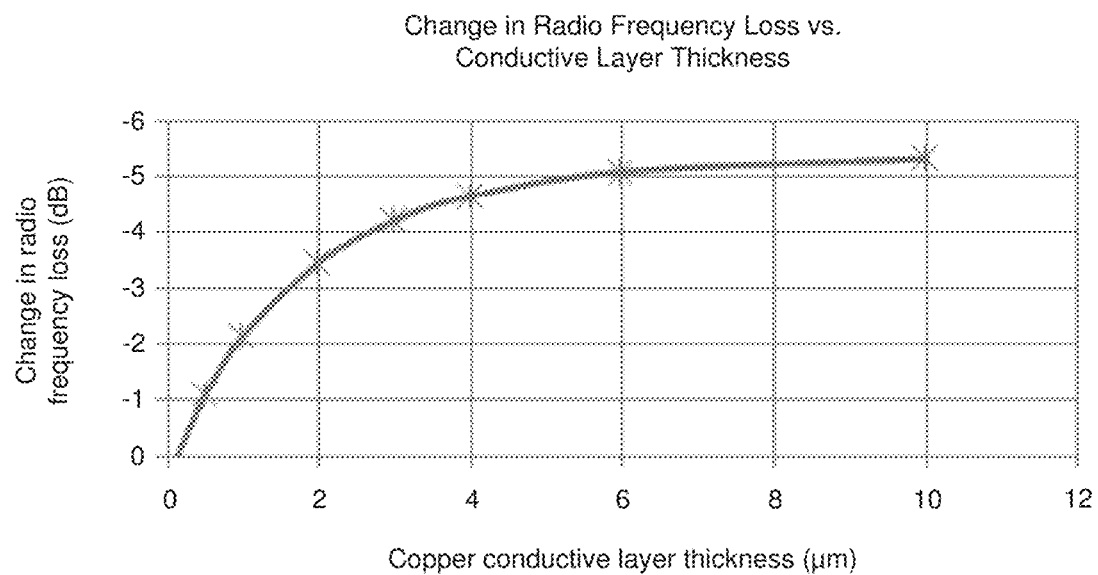
FIG. 9 illustrates the change in radio frequency loss versus copper conductive layer thickness for a multilayer protective cover in accordance with embodiments of the invention.
Figure 10:
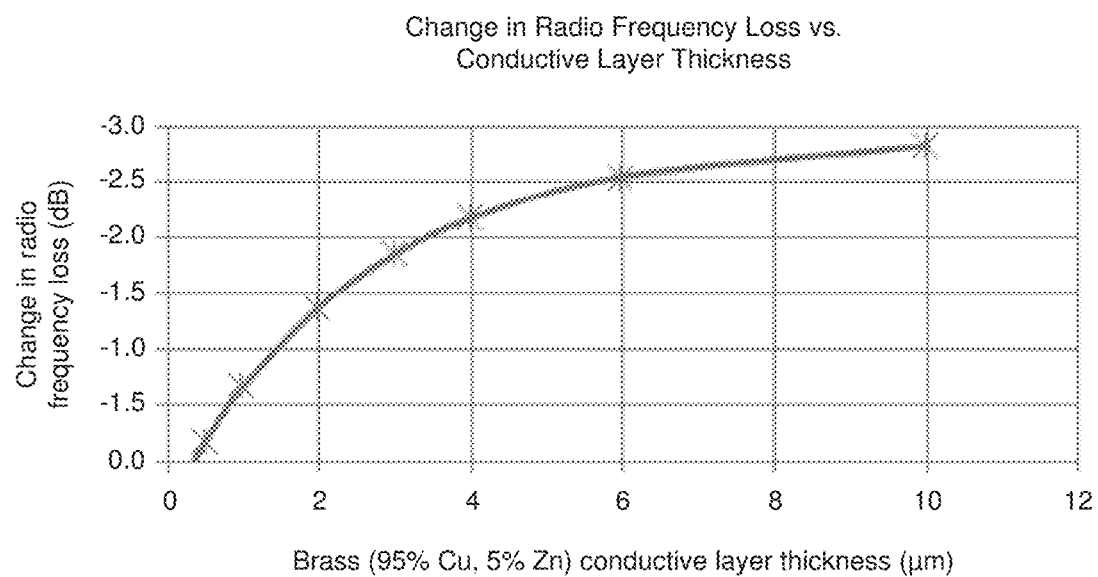
FIG. 10 illustrates the change in radio frequency loss versus brass conductive layer thickness for a multilayer protective cover in accordance with embodiments of the invention.

FIGS. 8A-8D illustrate various example multilayer protective coverings in accordance with embodiments of the invention, FIG. 8A illustrates an example structure of a multilayer protective covering including a thermally insulating layer, FIG. 8B illustrates another example structure of a multilayer protective covering including a thermally insulating layer, FIG. 8C illustrates yet another example structure of a multilayer protective covering including a thermally insulating layer, and FIG. 8D illustrates still another example structure of a multilayer protective covering including a thermally insulating layer. FIGS. 8A-8D illustrate several embodiments of representative segments of multilayer protective coverings. These representative segments may be examples of possible structures of multilayer protective coverings that include a thermally insulating layer.

Referring to FIGS. 8A-8D, several representative segments include a thermally insulating layer 872 in various configurations. Thermally insulating layer 872 may be configured to further prevent heat generated in outer layers from reaching an exposed inner surface of a multilayer protective covering. In various embodiments, thermally insulating layer 872 includes a thermal insulating material. In one embodiment, thermally insulating layer 872 includes a molding compound. In another embodiment, thermally insulating layer 872 includes glass. In still another embodiment, thermally insulating layer 872 includes silicon dioxide ($SiO_2$). In other embodiments, thermally insulating layer 872 may include other materials such as a thermoplastic, zirconia, acrylic glass, or Teflon.

FIG. 8A shows a representative segment 882 of a multilayer protective covering including a core layer 832 between an electrically conductive layer 842 and a thermally insulating layer 872. Representative segment 882 also includes an outer surface layer 852 and an inner surface layer 854.

FIG. 8B shows a representative segment 884 of a multilayer protective covering including an electrically conductive layer 842 and a thermally insulating layer 872. Notably, the structure of representative segment 884 does not include a core layer. Representative segment 884 also includes an outer surface layer 852 and an inner surface layer 854.

FIG. 8C shows a representative segment 886 of a multilayer protective covering similar to representative segment 882, but with a second outer surface layer 862 and a second inner surface layer 864. FIG. 8D show a representative segment 888 of a multilayer protective covering similar to representative segment 882, but without any surface layers. It should be noted that the structures described in this and other embodiments are by no means exhaustive. As an example, representative segment 884 could conceivably be formed without surfaces layers. Embodiments explicitly described are non-limiting as other variations may be apparent to a person of ordinary skill of the art.

FIG. 9 illustrates the change in radio frequency loss versus copper conductive layer thickness for a multilayer protective cover while Figure to illustrates the change in radio frequency loss versus brass conductive layer thickness for a multilayer protective cover in accordance with embodiments of the invention.

Referring to FIG. 9 and to, the change in radio frequency losses in a multilayer protective covering is illustrated as the thickness of an electrically conductive layer is increased. For the scenario of FIG. 9, the electrically conductive layer includes pure copper which has an electrical conductivity of about 58 MS/m. In the case of Figure to, the electrically conductive layer includes a brass alloy containing 95% copper and 5% zinc (CuZn5) which has an electrical conductivity of about 33 MS/m.

For both the pure copper electrically conductive layer and the CuZn5 brass conductive layer, radio frequency losses in the multilayer protective covering decrease as the electrically conductive layer thickness increases. For example, according to FIG. 9, a multilayer protective covering including a 2 µm thick layer of pure copper has about 3.4 dB lower radio frequency losses compared to a multilayer protective covering with only a core layer. Similarly, a multilayer protective covering including a 4 µm thick layer of CuZn5 brass has about 2.5 dB lower radio frequency losses compared to a multilayer protective covering with only a core layer.

As can be seen from FIG. 9 and to, as the electrically conductive layer increases in thickness, the additional benefit obtained by increasing the thickness of the electrically conductive layer is lessened. This may be related to the skin depth of the electrically conductive layer. Similar change in radio frequency loss versus electrically conductive layer curves may be obtained for other electrically conductive materials. It may be reasonable to expect that for materials with higher electrical conductivity the change in radio frequency loss will reach a maximum at a lower thickness value. It may also be reasonable to expect that the maximum change in radio frequency loss will be larger for materials with higher electrical conductivity.

Example embodiments of the invention are summarized here. Other embodiments can also be understood from the entirety of the specification and claims filed herein.

Example 1

A device package including: a semiconductor device disposed on a substrate; and a covering disposed on the substrate and surrounding the semiconductor device, the covering including a void between an interior surface of the covering and the semiconductor device, a first layer including a first electrical conductivity and a first thickness, and a second layer disposed under the first layer, the second layer including a second electrical conductivity and a second thickness, where the first electrical conductivity is greater than the second electrical conductivity, and where the first thickness is less than the second thickness.

Example 2

The device package of example 1, where the covering is configured to conduct an induced electrical current, and where a majority of the induced electrical current is configured to flow in the first layer of the covering.

Example 3

The device package of example 2, where less than 1% of the induced electrical current is configured to flow in the second layer of the covering.

Example 4

The device package of one of examples 1 to 3, further including: an integrated circuit chip disposed on the substrate, where the semiconductor device includes a sensor; and an opening vertically aligned with the sensor, where the sensor is configured to interact with a region outside the device package through the opening.

Example 5

The device package of example 4, where the opening is disposed in the substrate beneath the sensor.

Example 6

The device package of example 4, where the opening is disposed in the covering above the sensor.

Example 7

The device package of one of examples 1 to 4, where the sensor is a microelectromechanical systems (MEMS) device.

Example 8

The device package of example 7, where the MEMS device includes a MEMS microphone.

Example 9

The device package of one of examples 1 to 8, where the covering further includes a third layer disposed over the first layer, the third layer including an exterior exposed surface, and a fourth layer disposed under the second layer, the fourth layer including an interior exposed surface, where each of the third layer and the fourth layer include a corrosion resistant material.

Example 10

The device package of example 9, where each of the third layer and the fourth layer include a nickel phosphorus layer and a gold layer, and where the exterior exposed surface and the interior exposed surface include gold.

Example 11

The device package of one of examples 1 to 10, where the first layer includes copper and the second layer includes brass.

Example 12

A method of forming a device package, the method including: attaching a semiconductor device to a substrate; forming a covering by forming a first layer over a second layer, where a conductivity of the first layer is greater than a conductivity of the second layer, and where a thickness of the first layer is less than a thickness of the second layer; mechanically shaping the covering to a cup-shaped structure including an opening; and attaching the covering to the substrate with the semiconductor device, where the semiconductor device is disposed in the opening.

Example 13

The method of example 12, where forming the first layer over the second layer includes plating a material onto a surface of the second layer.

Example 14

The method of example 13, where the plating is an electroless plating process.

Example 15

The method of one of examples 12 to 14, where forming the first layer over the second layer includes using a chemical deposition process, or sputtering.

Example 16

The method of one of examples 12 to 14, where the first layer includes a metal foil, and where forming the first layer over the second layer includes laminating the metal foil onto a surface of the second layer.

Example 17

The method of one of examples 12 to 16, further including: attaching an integrated circuit chip to the substrate, where the opening surrounds the integrated circuit chip; and electrically coupling the integrated circuit chip to the substrate.

Example 18

The method of one of examples 12 to 17, further including: forming a through substrate opening in the substrate, the through substrate opening extending from a first major surface of the substrate to a second major surface of the substrate, where the semiconductor device includes a sensor, where the through substrate opening is beneath the sensor and vertically aligned with the sensor, and where the sensor is configured to interact with a region outside the device package through the through substrate opening.

Example 19

The method of one of examples 12 to 18, where the semiconductor device includes a microelectromechanical systems (MEMS) device.

Example 20

The method of example 19, where the MEMS device includes a MEMS microphone.

Example 21

The method of one of examples 12 to 20, further including: forming a third layer including an exterior exposed surface over the first layer; and forming a fourth layer including an interior exposed surface under the second layer, where each of the third layer and the fourth layer include a corrosion resistant material.

Example 22

The method of example 21, where each of the third layer and the fourth layer include a nickel phosphorus layer and a gold layer, and where the exterior exposed surface and the interior exposed surface include gold.

Example 23

The method of one of examples 12 to 23, where the first layer includes copper and the second layer includes brass.

Example 24

A device package including: a multilayer protective covering including a core layer for mechanically supporting the multilayer protective covering, the core layer including a first thickness less than 200 µm, an electrically conductive layer disposed over a first surface of the core layer, the electrically conductive layer including a second thickness less than 20 µm, where the multilayer protective covering is indented to include a recessed region, where the core layer surrounds the recessed region, a corrosion resistant layer disposed over the electrically conductive layer, and a metal layer disposed over the corrosion resistant layer.

Example 25

The device package of example 24, where: the core layer includes a first type of brass, the electrically conductive layer includes a second type of brass, an electrical conductivity of the second type of brass is greater than an electrical conductivity of the first type of brass, and the second thickness is less than about 10 µm.

Example 26

The device package of one of examples 24 and 25, where: the core layer includes one of brass or nickel silver; the first thickness is about 100 µm; the electrically conductive layer includes copper; and the second thickness is between about 3 µm to 6 µm.

Example 27

The device package of one of examples 24 to 26, further including: a thermally insulating layer disposed under a second surface of the core layer, the second surface being opposite the first surface.

Example 28

The device package of example 27, further including: a second corrosion resistant layer disposed under the core layer; and a second metal layer disposed between the second corrosion resistant layer and the thermally insulating layer.

Example 29

The device package of one of examples 24 to 28, further including: a finishing layer disposed under the core layer, the corrosion resistant layer and the finishing layer including nickel and phosphorus, where a thickness of the finishing layer is between about 0.2 µm to about 3 µm.

Example 30

The device package of one of examples 24 to 29, where the metal layer includes gold.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, the embodiments described in FIGS. 1-8 may be combined with each other in various embodiments. It is therefore intended that the appended claims encompass any such modifications or embodiments.

What is claimed is:

1. A device package comprising:
a multilayer protective covering comprising
a core layer for mechanically supporting the multilayer protective covering, the core layer comprising a first thickness less than 200 µm,
an electrically conductive layer disposed over a first surface of the core layer, the electrically conductive layer comprising a second thickness less than 20 µm, wherein the multilayer protective covering is indented to comprise a recessed region, wherein the core layer surrounds the recessed region,
a corrosion resistant layer disposed over the electrically conductive layer, and
a metal layer disposed over the corrosion resistant layer.

2. The device package of claim 1, wherein:
the core layer comprises a first type of brass,
the electrically conductive layer comprises a second type of brass,
an electrical conductivity of the second type of brass is greater than an electrical conductivity of the first type of brass, and
the second thickness is less than about to 10 µm.

3. The device package of claim 1, wherein:
the core layer comprises one of brass or nickel silver;
the first thickness is about 100 µm;
the electrically conductive layer comprises copper; and
the second thickness is between about 3 µm to 6 µm.

4. The device package of claim 1, further comprising:
a thermally insulating layer disposed under a second surface of the core layer, the second surface being opposite the first surface.

5. The device package of claim 4, further comprising:
a second corrosion resistant layer disposed under the core layer; and
a second metal layer disposed between the second corrosion resistant layer and the thermally insulating layer.

6. The device package of claim 1, further comprising:
a finishing layer disposed under the core layer, the corrosion resistant layer and the finishing layer comprising nickel and phosphorus, wherein a thickness of the finishing layer is between about 0.2 µm to about 3 µm.

7. The device package of claim 1, wherein the metal layer comprises gold.

8. The device package of claim 1, wherein each of the layers in the multilayer protective covering is directly coupled to an adjacent layer.

9. A device package, comprising:
a core layer comprising a first thickness less than 200 µm;
an electrically conductive layer comprising a second thickness less than 20 µm disposed over the core layer, wherein the core layer and the electrically conductive layer comprise a recessed region, and wherein the core layer and the electrically conductive layer surrounds the recessed region;
a first inner surface layer disposed under the core layer;
a second inner surface layer disposed under the first inner surface layer;
a first outer surface layer disposed over the electrically conductive layer; and
a second outer surface layer disposed over the first outer surface layer.

10. The device package of claim 9, wherein the core layer comprises a mechanical support layer comprising brass comprising about 30% zinc, nickel silver comprising about 20% zinc, thermoplastic, glass, or rubber.

11. The device package of claim 9, wherein the electrically conductive layer comprises a layer comprising copper or a copper alloy, silver, or a multilayer material.

12. The device package of claim 9, wherein the first inner surface layer and first outer surface layer comprise a layer comprising nickel phosphorous.

13. The device package of claim 9, wherein the second inner surface layer and second outer surface layer comprise a layer comprising gold.

14. The device package of claim 9, wherein each of the layers in the device package is directly coupled to an adjacent layer.

15. A device package, comprising:
a core layer comprising a first thickness less than 200 µm;
an electrically conductive layer comprising a second thickness less than 20 µm disposed over the core layer;
a thermally insulating layer disposed under the core layer, wherein the core layer, the electrically conductive layer, and the thermally insulating layer comprise a recessed region, and wherein the core layer and the electrically conductive layer surrounds the recessed region;
a first inner surface layer disposed under the thermally insulating layer;
a second inner surface layer disposed under the first inner surface layer;
a first outer surface layer disposed over the electrically conductive layer; and
a second outer surface layer disposed over the first outer surface layer.

16. The device package of claim 15, wherein the core layer comprises a mechanical support layer comprising brass comprising about 30% zinc, nickel silver comprising about 20% zinc, thermoplastic, glass, or rubber.

17. The device package of claim 15, wherein the electrically conductive layer comprises a layer comprising copper or a copper alloy, silver, or a multilayer material.

18. The device package of claim 15, wherein the thermally insulating layer comprises a layer comprising silicon dioxide, thermoplastic, zirconia, acrylic glass, or Teflon.

19. The device package of claim 15, wherein the first inner surface layer and first outer surface layer comprise a layer comprising nickel phosphorous.

20. The device package of claim 15, wherein the second inner surface layer and second outer surface layer comprise a layer comprising gold.

21. The device package of claim 15, wherein each of the layers in the device package is directly coupled to an adjacent layer.

\* \* \* \* \*

UNITED STATES PATENT AND TRADEMARK OFFICE
CERTIFICATE OF CORRECTION

PATENT NO. : 11,574,879 B2
APPLICATION NO. : 16/402683
DATED : February 7, 2023
INVENTOR(S) : Pedro Augusto Borrego Lambin Torres Amaral It is certified that error appears in the above-identified patent and that said Letters Patent is hereby corrected as shown below:

In the Claims

Claim 2, Column 19, Line 43; delete "about to 10 μm" and insert -- about 10 μm --.

Signed and Sealed this
Twenty-first Day of March, 2023

Katherine Kelly Vidal
Director of the United States Patent and Trademark Office